United States Patent [19]
Bárczy et al.

[11] Patent Number: 5,429,341
[45] Date of Patent: Jul. 4, 1995

[54] APPARATUS AND CAPSULE FOR CARRYING OUT PROCESSES OF DIRECTED CRYSTALLIZATION, ESPECIALLY IN COSMIC SPACE CONDITIONS

[75] Inventors: Pál Bárczy, Miskolc; Gábor Buza, Budapest; György Czél, Miskolc Egyetemváros; József Fancsali; Péter Makk, both of Miskolc; Csaba Raffay, Budapest; András Roósz; Béla Tolvaj, both of Miskolc, all of Hungary

[73] Assignee: Miskolci Egyetem, Miskolc-Egyetemváros, Hungary

[21] Appl. No.: 38,974

[22] Filed: Mar. 29, 1993

Related U.S. Application Data
[63] Continuation-in-part of Ser. No. 870,331, Apr. 17, 1992, abandoned.

[30] Foreign Application Priority Data
Apr. 17, 1991 [HU] Hungary ............... 1254/91

[51] Int. Cl.$^6$ .................................. C22B 4/08
[52] U.S. Cl. .................................. 266/87; 266/99; 266/160; 266/207; 266/276; 117/901
[58] Field of Search .............. 266/99, 207, 87, 160, 266/207, 276; 117/901

[56] References Cited
U.S. PATENT DOCUMENTS
| | | | |
|---|---|---|---|
| 4,158,742 | 6/1979 | Aldrich | 373/110 |
| 4,423,515 | 12/1983 | Riegler et al. | 373/81 |
| 4,603,730 | 5/1986 | Davis et al. | 165/61 |
| 4,734,127 | 3/1988 | Iuchi et al. | 75/10.11 |

Primary Examiner—Melvyn J. Andrews
Attorney, Agent, or Firm—Spencer, Frank & Schneider

[57] ABSTRACT

The present invention refers to an apparatus and a capsule for carrying out processes of directed crystallization, especially in cosmic space conditions. The apparatus comprises a first compartment forming a multizone furnace having an inner surface divided into heating zones for heating up material pieces to be processed, and a second compartment for receiving capsule holders bearing capsules for receiving the material pieces, the first and second compartments being connected with one another through a cooled neck part and determining together a common closed space, the second compartment includes an upper and a lower annular rims prepared with cutouts for capsule holders, the capsule holders and the rims forming together a magazine of capsules, and revolving manipulating means. The capsule comprises a metallic mantle, a tube type crucible made with a ceramic wall arranged within the metallic mantle, the metallic mantle and crucible being opened from one side, at least one thermoelement and having a respective wire built-in into the ceramic wall and a head part with elements fitting to outer guiding means, the head part including contacting means for forwarding electric signals via the wire to an outer control unit.

16 Claims, 10 Drawing Sheets

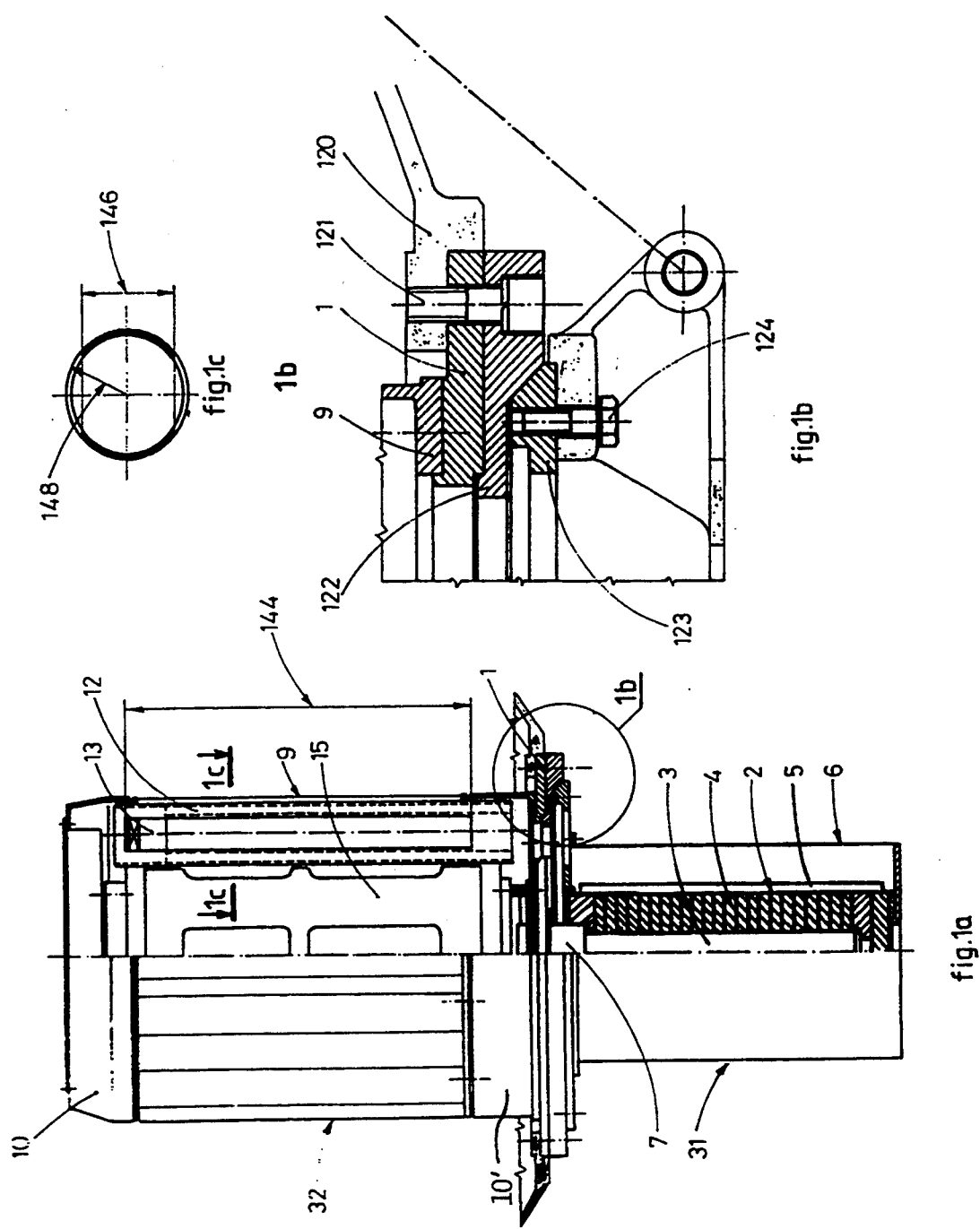

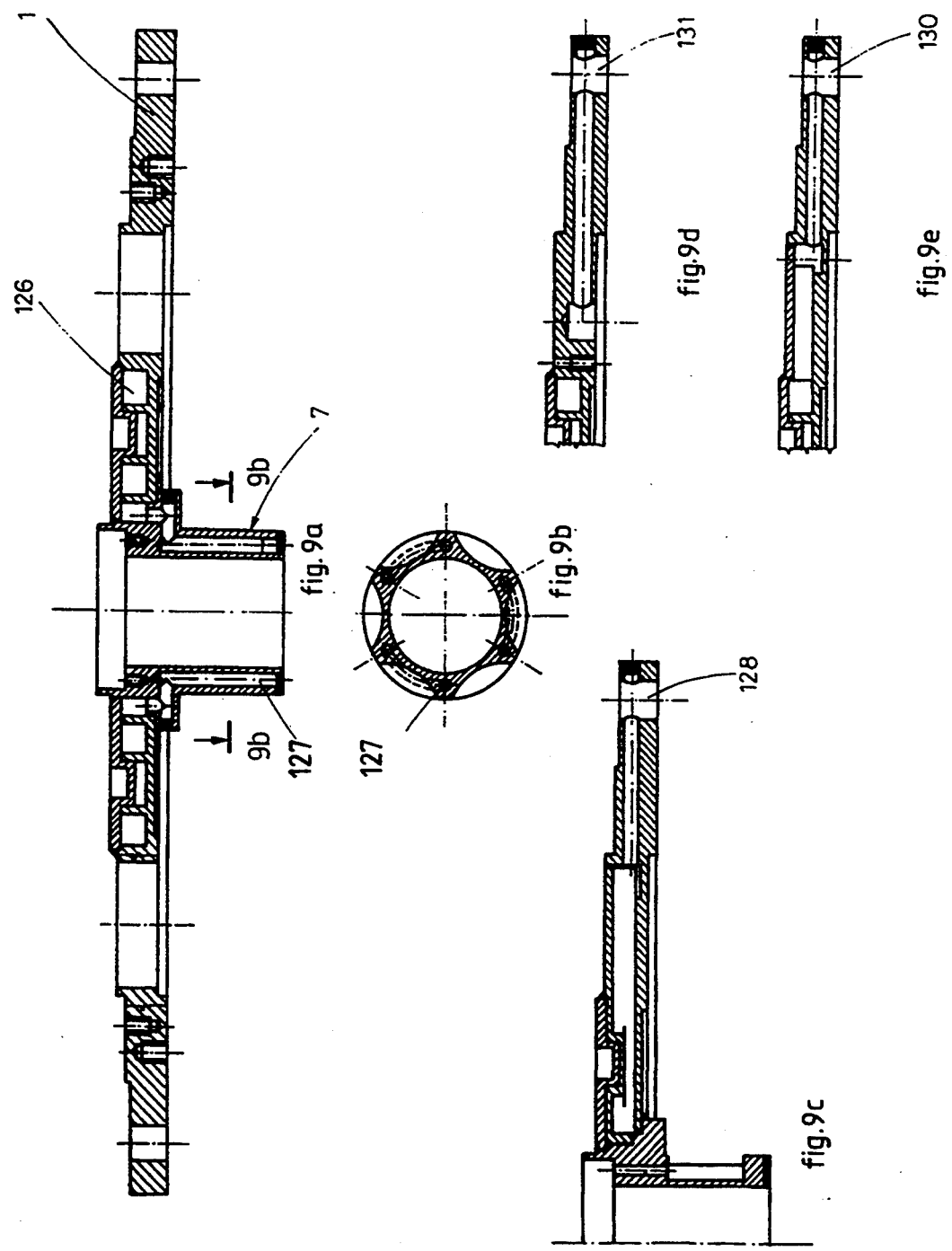

APPARATUS AND CAPSULE FOR CARRYING OUT PROCESSES OF DIRECTED CRYSTALLIZATION, ESPECIALLY IN COSMIC SPACE CONDITIONS

This application is a continuation-in-part of application Ser. No. 07/870,331, filed Apr. 17, 1992, now abandoned.

FIELD OF INVENTION

The present invention refers to an apparatus and a capsule for carrying out processes of directed crystallization, especially in cosmic space conditions. The apparatus comprises multizone heating apparatus and capsules for carrying out the crystallization process, wherein the number of the capsules is limited by the available space and the apparatus renders it possible to generate one crystal or more of different sizes and required compositions. The capsule is made with walls defining a closed or closable inner space.

BACKGROUND OF THE INVENTION

According to the state of the art the processes of directed crystallization are carried out in apparatuses of different kinds operating on different principles. One of them is equipped with a localized heating system for generating a homogeneous temperature field remaining in standing position and means for low-speed forwarding of the crystals within the temperature field. Different solutions of this kind have become known, such as the Bridgman-Stockberger method or the Czochralski method etc. There are also known methods of crystallization, wherein a lengthy piece of material is arranged in a fixed position and a heating zone surrounding the piece is translated along the longitudinal axis of the piece of the material (e.g. zone melting or refining process, floating zone method or travelling heater method). The common negative features of the processes and methods listed up above are the following:
- remarkable differences of temperature can be experienced within the same piece of material, the differences causing elastic tensions and lattice imperfections (defects) in the solid crystalline lattice and in the melted zone the flow of the material, resulting in undesired and uncontrollable changes of concentration of selected components,
- the crystal or the heating zone is translated along the longitudinal axis by means of a motor which is, when operating, the source of vibration and microacceleration, which are especially detrimental in space conditions.

The features mentioned above impose a very significant limitation to the possibility of producing crystals with a reduced number of lattice imperfections.

The disadvantages mentioned above can be avoided in some of the multizone apparatuses for crystallization, wherein such control is realized whereby
- in radial directions the temperature differences can be minimized,
- in longitudinal direction the temperature differences can be controlled and lowered to the required extent,
- the crystallization process is carried out without relative movement of different pads of the apparatus.

The specification to U.S. Pat. No 4,423,515 discloses a multizone furnace capable of generating temperature differences having a large slope gradient and excluding the undesired radial heat flow within the working space of the furnace. The furnace consists of annular elements which define isolating and heating layers. The heating elements of the heating layers are arranged in recesses of the isolating rings. The outer ring of the heating layer is made of a material having very good heat conductivity (especially aluminum) whereby effective heat removal from the outer surface of the furnace is ensured. The outlets of the heating elements are turned by 90° with respect to one another. Means for sensing the temperature may be arranged within holes prepared in the isolating elements.

The heat removal from the outer surface is intended to make the steady heat introduction through the heating elements necessary. Thereby it is guaranteed that, if required, the temperature can be changed very quickly and that heat flow is generated in the working space only in an axial direction. The heat removal from the outside of the furnace is ensured by contacting the surfaces with an air stream, cooling water or other cooling medium.

Heating is controlled by a respective control unit operating on the basis of a loaded program stored in a memory unit or modified after loading.

The specification to U.S. Pat. No. 4,734,127 discloses a method of purifying aluminium by carrying out fractional crystallization in the atmosphere of a protective gas filling out the internal space of a cylindric furnace. The contents of the internal space are heated by a higher number of heating elements arranged one over another. The mentioned heating elements are divided by at least one cooling zone wherein the crystals are growing. The crystals are removed from the inner surface by a compacting scraper which forwards them to the lower regions of the furnace and compacts them. According to the teaching of this patent the power consumption of some of the heating elements surrounding the compacted crystals can be reduced.

In this specification, the drawings include figures showing two kinds of furnace, the first having one heating zone and the second having three such zones. The specification discloses also the embodiment of the compacting scraper equipped with a heated mandrel and a motor for lowering, and further a doubled embodiment of the furnace.

The solutions analyzed above are also loaded with some disadvantages and especially the following:
- the power consumption is remarkably high and it is as higher the temperature gradient desired to be generated,
- the gas filling out the internal space is in convective flow which cannot be controlled in any way,
- the furnace offers the possibility of producing only one working piece (crystal).

The cosmic investigations involve specific problems. The crystallization processes to be carried out in the cosmic space are intended to make use of conditions where only microgravitation may be present and it is intended to reduce microgravitation as much as possible. Any mechanical motion results in deterioration of the gravitation conditions and if equipped with a motor or other mechanical means operating during crystallization, the respective apparatuses cannot be prepared with microgravitation lower than $10^{-5}$ g (g means the gravitational acceleration). Hence, in the case of apparatuses for carrying out directed crystallization processes in astronautical research, it is especially important to exclude mechanical motions. When growing crystals in the cosmic space conditions it is extremely important to ensure that the melting crucible remain motionless.

The generic problem of the cosmic space investigations is that the energy consumption of any device applied should be very low. The intensity of the energy dissipation has to be limited also to a very low extent, e.g. to 50 W for units. Otherwise, the temperature control in the inner space of the cosmic vehicle may become difficult. This impose very strict limitations to the equipment used for energy transformation, e.g. to the different kinds of the DC to AC converters which should show efficiency as high as at least 90%. A further requirement is that no substance may be deliberated by any apparatus and especially by a crystallization apparatus which can cause corrosion, explosion or is capable of shielding the telecommunication means. Another requirement is that with regard to the high costs of preparing and operating the different kinds of equipment applied in the cosmic space vehicles the apparatus should be capable of producing as high of a number of different materials as possible. The operation should be realizable during the full flight time in an autonomous way with high reliability.

SUMMARY OF THE INVENTION

The intention of the present invention is to create an apparatus for carrying out directed crystallization processes which renders it possible to prepare more pieces of crystals one after another especially in cosmic space conditions during long space flights in controlled and predetermined conditions, according to scientific programs. It is also intended to prepare a capsule which can facilitate the scientific investigations of crystallization processes.

The present invention proposes an apparatus for carrying out directed crystallization processes, especially in cosmic space conditions, wherein the apparatus comprises a multizone furnace for heating up a working piece and a control unit for controlling the heating process in the zones of the furnace according to a predetermined program, wherein the control is provided independently for the different zones. The novel features of the apparatus are that the multizone furnace can be divided into a lower and an upper space compartments forming an advantageously cylindric body, the lower and upper space compartments being connected by a flange, wherein the lower and upper compartments are surrounded with a ring shaped rim including a magazine of capsules equipped with cutouts for receiving, fixing and holding more capsule holders. Further at least on the upper or the lower compartments, there are revolving manipulating means arranged for ensuring fixation of the capsule holders in radial directions, the selection of the capsules, the translation of the capsules in the space, and manipulating with capsule holders during inserting and removal of the capsules into and from the furnace. The furnace is equipped further with a cooled flange with a cooled neck part whereby the capsules can be fixed and connected, and further with cooling means for cooling the flange. Under the surface of the cooled neck part the furnace comprises, from the side of the magazine of capsules, contacting means for realizing electric connections to thermoelements arranged on the capsules. The number of the contacting means conforms with the number of the thermoelements.

The present invention proposes also a capsule for use in the apparatus. This capsule, used for carrying out processes of directed crystallization, especially in cosmic space conditions, comprises a metallic mantle, a tube type crucible made with a ceramic wall arranged within the metallic mantle, the metallic mantle and crucible being opened from one side, at least one thermoelement having a respective wire built-in into the ceramic wall and a head pad with elements fitting to outer guiding means, wherein the head part includes contacting means for forwarding electric signals of respective at least one thermoelement transmitted via the wire to an outer control unit.

The capsule of the invention can be of opened and closed design and the latter is realized advantageously with a head part constituting a sealing element which closes the crucible from the opened side and is equipped with or is connected with a controlled inlet valve.

It is also a preferred embodiment of the proposed capsule wherein within the wall the thermoelement and its wire are surrounded by magnesia powder and the crucible arranged within the mantle is at least partly surrounded by a filler material constituted by ceramic filaments.

BRIEF DESCRIPTION OF THE DRAWINGS

The invention will be further described in more detail with reference to the accompanying drawings showing by way of example only some preferred embodiments of the apparatus proposed by the invention. In the drawings FIG. 1a illustrates a side-view and a cross-sectioned part of a preferred embodiment of the apparatus of the invention to be applied in cosmic space conditions, when the apparatus should be separated from a space object, FIG. 1b illustrates section 1b selected in FIG. 1a forming a connecting surface for a furnace body, means for introducing capsules and a space object, FIG. 1c shows the cross-section of a capsule holder along section line 1c-1c in FIG. 1a, FIG. 2 illustrates an axonometric view of movements of revolving manipulating means of a feeding unit for introducing capsules, FIG. 3 an axonometric view of a cooled neck part and a cooled flange with illustration of the cooling processes, FIG. 4 a cross-section of the apparatus of the invention in situation when the furnace unit cannot be separated from the cooled flange and the capsule is arranged within the furnace, FIG. 5a is a sectional top view taken along section line 5a-5a in FIG. 4 of the feeding unit during the introduction of capsule holders in a magazine of capsules, wherein a drawing unit arranged a capsule together with the holder in an axial line of the apparatus, FIG. 5b a cross-section taken along section line 5b-5b in FIG. 5a of a drawing unit and its prestretching elements, FIG. 5c a cross-section taken along section line 5c-5c in FIG. 5a of a fragment of the mechanism of axial movement, FIG. 5d a cross-section taken along section line 5d-5d in FIG. 5a of a fragment of a blocking unit, FIG. 5e the side-view with partial cross-section taken along section line 5e-5e in FIG. 5a of a central wheel of a gear reduction applied in realization of the axial movement, FIG. 5f the side-view with partial cross-section taken along section line 5f–5f in FIG. 5a of an intermediate gear wheel of the system of vertical movement, FIG. 5g the sectional side-view taken along section line 5g–5g in FIG. 5a of a lower flange and a working rack of the capsule holder, FIG. 6a a cross-section taken along section line 6a–6a in FIG. 4 of the feeding unit with capsule drawn-in into the middle point, FIG. 6b a cross-section taken along section line 6b–6b in FIG. 6a of the mechanism for manipulating with retractor plate of the lower capsule holder, FIG. 6c the side-view with partial cross-section taken along section line 6c–6c in FIG. 6a of a gear wheel driving the lower retractor plate, FIG. 7a a simplified cross-section of a feeding unit showing the relative arrangement of driving units for realization of movement in three directions, FIG. 7b the sectional top-view taken along section line 7b–7b in FIG. 7a of the magazine of the capsules and the revolving manipulating means in situation when the capsule and the capsule holder connected with the retractor plate lie outside of the axial line, FIG. 7c a schematic view taken along line 7c–7c in FIG. 7b of a driving unit for dividing and blocking unit, FIG. 7d a schematic view of the blocking unit, FIG. 7e a perspective view taken along line 7d–7d in FIG. 7c of the fork for drawing the capsule, FIG. 8 a cross-section of the cooled covering lid and the furnace unit, FIG. 9a a longitudinal cross-section of the cooled flange with the cooled neck part, FIG. 9b the cross-section taken along line 9b–9b in FIG. 9a of the cooled neck part, FIG. 9c a longitudinal cross-section of the input channel of the system of cooling the flange, FIG. 9d an inlet connection of the cooling system of the furnace unit, FIG. 9e a longitudinal cross-section of the output channel of the system of cooling the flange, FIG. 10a a longitudinal cross-section of an open capsule and the capsule holder, FIG. 10b a cross-section of the head part of the capsule, FIG. 10c a cross-section of the shaft part of the capsule together with the capsule holder, FIG. 10d the cross-section of guiding system for the capsule shaft in the capsule holder, FIG. 11a a cross-section of a closed capsule without thermoelements, contact holder and contacting means, and FIG. 11b a cross-section of the valve part of the capsule taken from section 11b in FIG. 11a.

DETAILED DESCRIPTION OF THE INVENTION AND PREFERRED EMBODIMENTS

Figure 3:
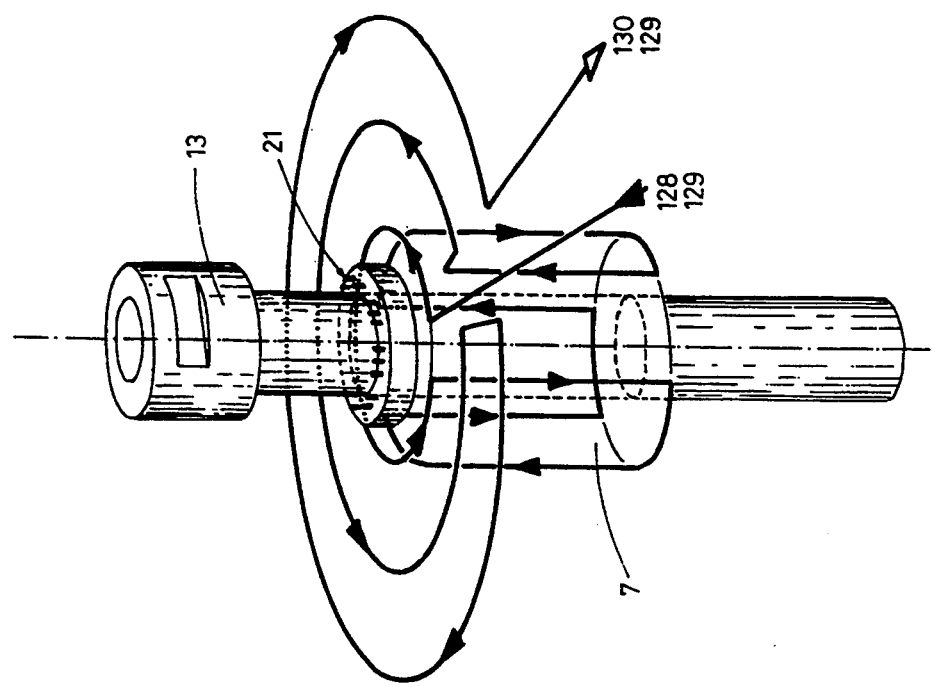

As it is shown in the drawings, the present invention proposes an apparatus for carrying out directed crystallization process and a capsule for the use in this apparatus. The apparatus illustrated here is a preferred embodiment of about 2,5 kW power.

The apparatus (FIG. 1a) according to the invention has lower (first) and upper (second) space compartments 31 and 32. The lower space compartment 31 forming a furnace unit can be fixed on the outer surface of a spacecraft and the upper space compartment 32 applied as a feeding unit is arranged within the spacecraft (cosmic object) and they are connected over a cooled flange 1 having a cooled neck part 7. Cooled flange 1 has a circular cross-section and is located at the upper end of cooled neck part 7. The lower and upper space compartments 31 and 32 determine a common space. The lower space compartment 31 forms a furnace 2 of multizone design having a working space 3 limited by heating elements 4 arranged on the inner surface of a circular wall determining the working space 3. The heating elements 4 are surrounded from outer side by an insulating cover 5 made of a material of very low heat conductivity and this cover is contacted with a mantle 6 made of metal and which can be equipped with cooling means working with a cooling liquid. Each heating element 4 determines a respective heating zone; they are connected with a control unit for regulating the temperature of each zone separately. In an axial direction there are more zones provided, all zones are identical and their number is high, especially from 9 to 30. The furnace 2 of this design is very advantageous in that the temperature gradient can be as high as desired in radial directions but the heat transport is characterized by very low intensity. Hence, the temperature in the working space 3 is determined practically only by the heat power of the heating units 4.

Figure 5:
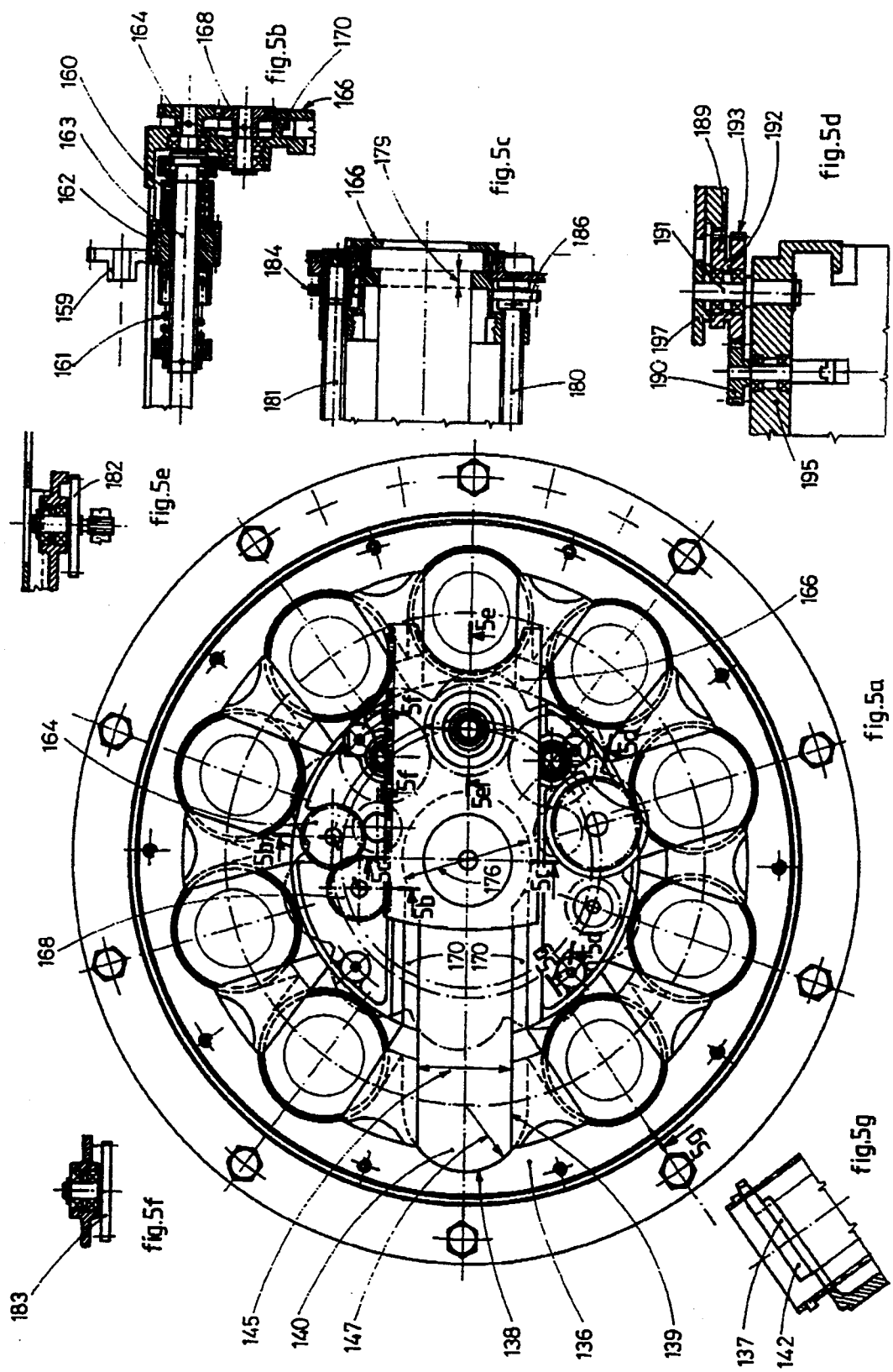
Figure 6:
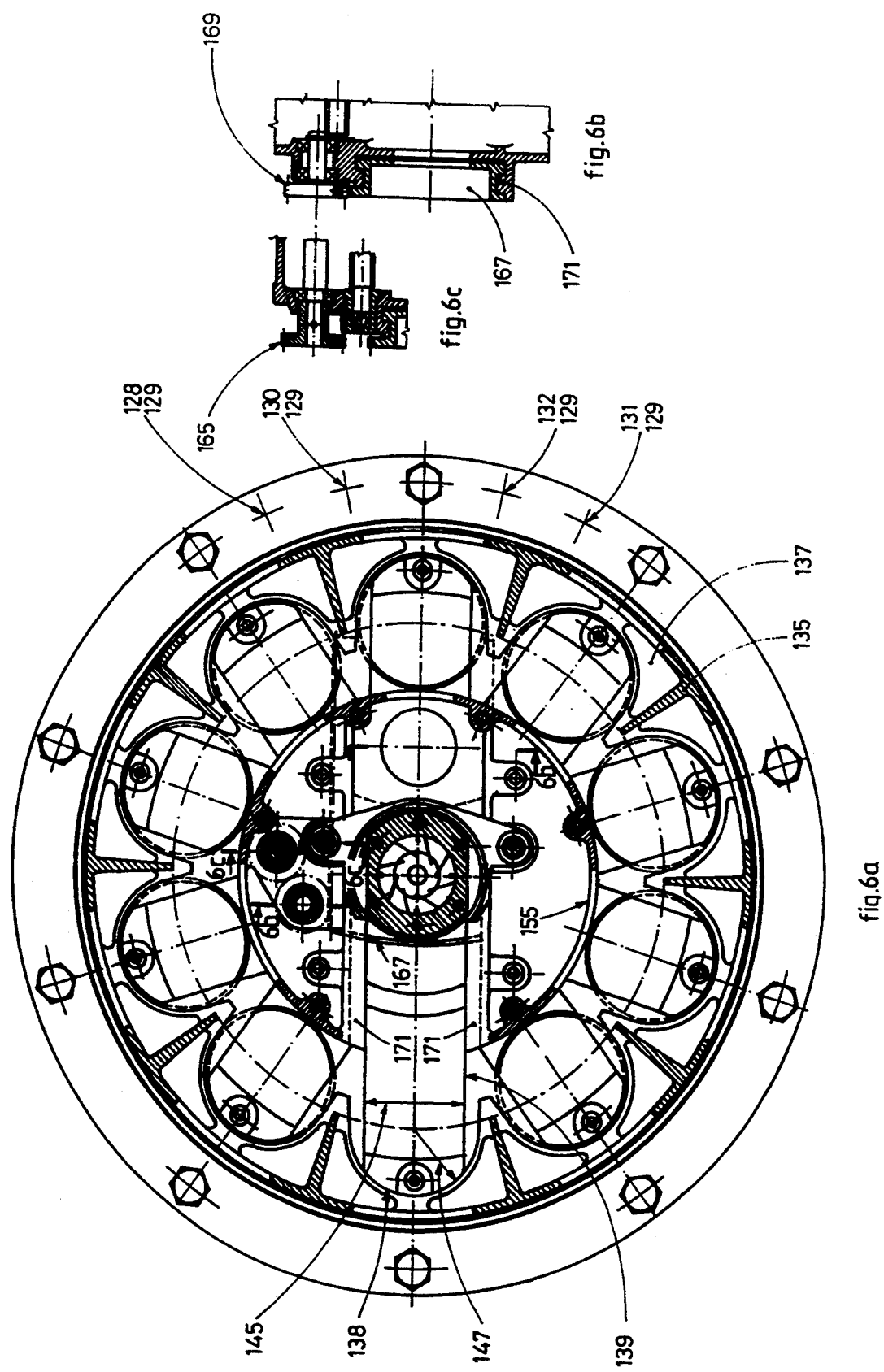
Figure 7:
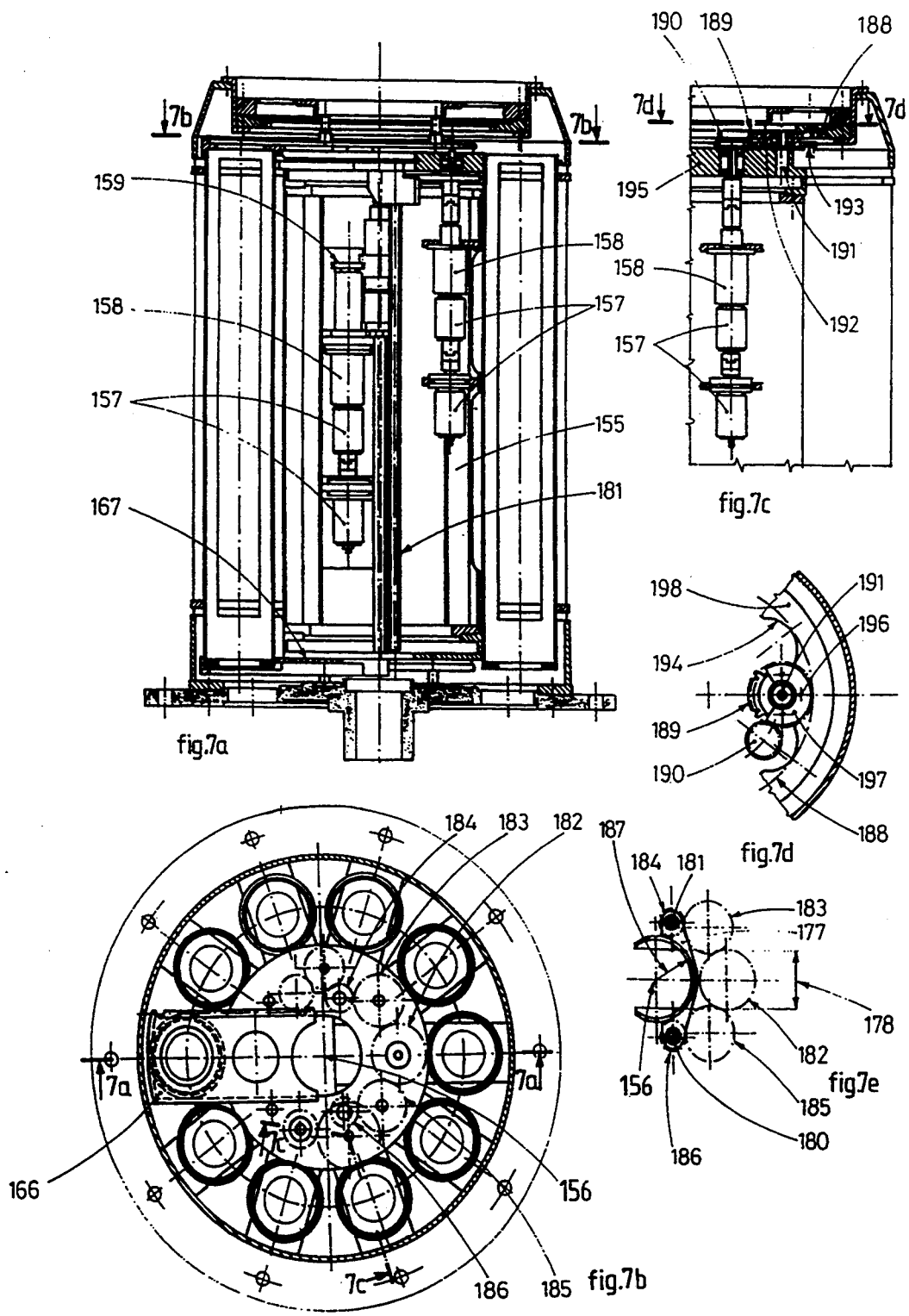

The majority of the heat power introduced into the working space 3 is taken over by a cooled neck part 7 of the cooled flange 1 contacted with the furnace 2 and with the cooled flange 1 wherein the cooled neck part 7 is equipped with cooling system working with an appropriate cooling liquid. The cooled neck part 7 and the furnace 2 are arranged along a common axis, and are connected through a fitting flange 122 and an orientating flange 123, and with a magazine 9 of capsules 13 matching the cooled flange 1, wherein the magazine 9 receives capsules 13 bearing pieces of material to be processed by crystallization. The magazine 9 of capsules 13 constitutes a cylindrical body opened at both ends, wherein in the mantle openings (not shown in the figures) are provided. This magazine 9 is made with an upper 10 and a lower rims 10, provided with cutouts 11 for receiving capsule holders 12 (FIGS. 5a, 6a, 7b). The rims 10, 10' constitute annular plate type elements. The capsule holder 12 is an elongated tubular body, e.g. a cylindrical tube with a longitudinal split, which is intended to protect the capsule 13 and to guide it before inserting it into the working space 3 of the furnace 2, further to give the space correct orientation of the capsule 13. In the tube type receiving part of the capsule holder 12 there are advantageously arranged special supporting means for guiding the capsule 13 in axial direction, i.e. guiding rings made of PTFE at one end and guiding shafts at the other end. The capsule holders 12 are arranged in the mentioned cutouts 11 of the rims 10, 10'.

As mentioned, the capsule holder 12 is a lengthy tube type body, e.g. cylindric tube with a longitudinal split which is intended to protect the capsule 13 against mechanical effects, from the other side it belongs to revolving manipulating means 15 playing important rule in the last. In the capsule holder 12 the capsule 13 is fixed in a recess 62 (FIG. 10a), wherein it can be translated by an actuating fork 177 which can forward it into the furnace 2. The capsule holder 12 is connected with the revolving manipulating means 15 by a rim 110. The actuating fork 177 opens the capsule holder 12 in two directions. The capsule 13 is fixed in the capsule holder 12 by orientating pins and this allows the capsule 13 to be introduced solely from the side of the rim 110. On the orientating pins 43 there are supporting pins 42 made of PTFE whereby friction is reduced during the movement.

In the inner space of the magazine 9 of capsules 13 revolving manipulating means 15 has roller pins 14 arranged for fixing the capsules 13 in a radial direction. The roller pins 14 ensure the correct position and the fixation of the revolving manipulating means 15 when selecting one of the capsules 13 for forwarding into the lower compartment 31. The revolving manipulating means 15 equipped with the roller pins 14 serves to forward one selected capsule 13 along the longitudinal axis of the furnace 2 together with the magazine 9, and further for translating the capsule 13 into the working space 3 and removing it therefrom after terminating the crystallization process by pulling the capsule 13 back into the capsule holder 12.

The capsule 13 and the capsule holder 12 are shown in FIGS. 10a to 10d. A cross-section of a closed capsule 13 can be seen in FIGS. 11a and 11b.

The capsule 13 is divided into a neck part and a shaft. The neck part includes a head part 18 and a suspending border 59. The suspending border 59 is welded to a metallic mantle 17 forming the shaft of the capsule and this shaft receives a cruicible 16 made of a ceramic material, especially alumina. The crucible may be of closed and opened design, the first being illustrated in the drawings and it is surrounded by the metallic mantle 17 made of a metallic substance of high general resistivity, especially of tantalum or stainless steel. In the ceramic wall of the crucible 16 recesses 44 are prepared for receiving thermoelements 20 of mantle type which are arranged in connection with contacting means 19 via their wires 34. The contacting means 19 are arranged within the suspending border 59 and they are fixed in their required position by a ring 35 made of PTFE or a ceramic composition. The contacting means creates the contacts necessary when data processing means, e.g. computer is applied. If necessary, the crucible 16 is supported within the mantle 17 by a filler composition 64 prepared from ceramic filaments. The filler composition 64 protects the crucible 16 against the deteriorating effects occurring during the start of a missile (especially the high acceleration), follows the dilatation processes of the crucible 16 during the changes of temperature.

The capsules 13 can be of opened or closed design as it will be explained in more detail later. The capsules of closed design (FIGS. 1a and 1b) are sealed by a seal 60 and closed with a lid 47 and an inlet valve 45; and are not connected with the atmosphere of the environment. The capsules 13 of opened design (FIGS. 10a to 10d) have common atmosphere with the furnace unit 31 wherein generally the temperature is about 1500° C. This is the basis of high resistivity requirements mentioned above.

The crucible 16 may have a part covering the opening of the capsule 13. In this case it may be equipped or connected with an inlet valve 45. Via this inlet the inner space of the crucible 16 can be evacuated or filled out with an atmosphere of predetermined specific composition. The head part 18 is preferably prepared with surface and construction elements for guiding the capsule 13 during the use in the apparatus of the invention.

From the description given above it is clear that in the upper part of the capsule 13 in the head part 18 the contacting means 19 are arranged for forwarding signals received from the thermoelements 20 to further, oppositely located contacting means 21 (FIG. 3) built-in to the cooled neck part 7 of the furnace 2. The contacting means 19 and 21 renders it possible to forward necessary pieces of information from the inner space of the capsule 13 to an outer control and data registration unit (not shown).

The majority of the heat energy introduced into the furnace 2 is taken over by the cooled neck part 7 arranged in axial direction and equipped with cooling means 22 which controls the temperature of the cooled flange 1, too.

Figure 2:
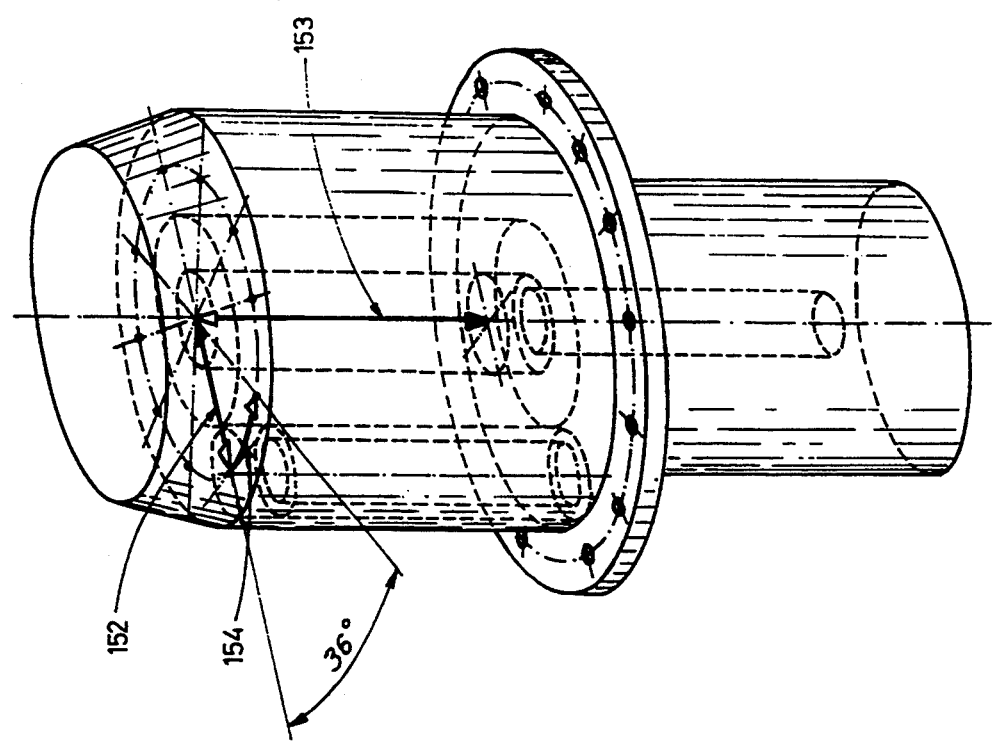

The revolving manipulating means 15 should be capable of carrying out three kinds of movements and controls (FIG. 2):

1. to rotate the upper space compartment by a predetermined angle following from the distribution of the capsule holders 12 (the swing 154 of FIG. 2);
2. to translate in radial direction a selected capsule 13 from and to the respective capsule holder 12 in a cutout 11 (the swing 154 and radial movement 152); and
3. to forward the selected capsule 13 in axial direction into the working space 3 (in radial direction 152).

Figure 4:
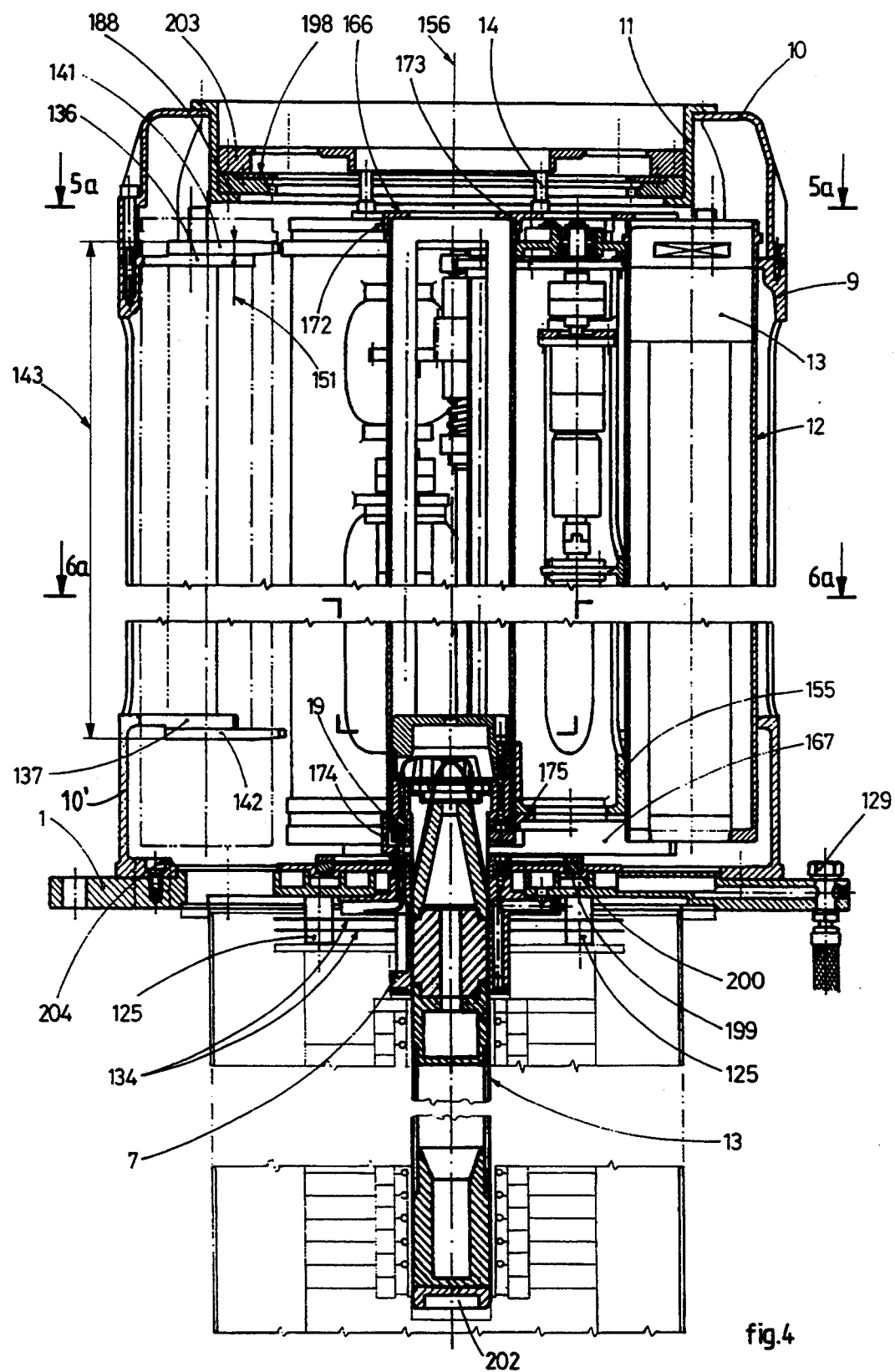

The way of operating the revolving manipulating means 15 as follows:

a) One of the capsules 13 is drawn out form the respective capsule holder 12 and translated in radial direction 152 to the axis of the upper space compartment 32 lying in the axis of the working space 3 and furnace 2. The capsule is kept in recesses 140 of the upper and lower flanges 136 and 137. This movement is realized by a mechanism comprising a gear wheel and a gear rack to be presented later. This mechanism can be designed on the basis of the general practice. The mechanism is connected with the shaft of a direct current motor 157 (FIG. 7a) supplied e.g. with 27 V voltage which forms with the gear wheel and rack units closed driving means. Of course, the mechanism driven by the motor is equipped with an automatic blockade of known design for limiting the way of movement.

b) The capsule 13 is forwarded along the longitudinal axis of the apparatus from the upper space compartment 32 into the lower space compartment 31 in the direction of axial direction 153. Thereby the contacting means 19 of the head part 18 and the contacting means 21 of the cooled neck part 7 are united and close an electric path for transmitting the signals of the thermoelements 20 to outer control and data registration equipment. A two-spindle arrangement to be described later of regular design is prepared for high precision realization of this translation. The drive is ensured by the direct current motor 157 referred above. The spindles are prepared with a self-blocking thread for limiting the movement and giving blockade in positions where necessary.

c) The contacting means 19 and 21 of the thermoelements 20 are united (according to FIG. 4).

d) After terminating the crystallization process the capsule 13 is allowed to cool (to lower the temperature e.g. below about 100° C.). Thereafter, following the axial direction 153, it is removed from the furnace 2 in a way reverse to that described in a) to c).

e) The capsule 13 removed from the furnace 2 is inserted back into the magazine 9 in radial direction 152. This can be carried out similarly to the steps shown in a) and by the same means.

f) The revolving manipulating means 15 rotate around the longitudinal axis (sharing movement in the direction of the swing 154), and after this, if necessary, the steps shown above in a) to d) are repeated. The revolving movement is ensured by the mentioned mechanism based on the gear wheel and gear rack. The blockade is also mechanical and automatic.

The end positions of the movements are signalized by electric position sensors, two sensors being assigned to each position. Similar sensors are applied for determining the positions following from the rotating (angle sharing) movement.

The feeding unit 32 forms a magazine for a number of capsules 13, for in this case, e.g. ten capsules. It is intended to take up the capsules 13 from the magazine 9, forward them to the furnace 2 and after terminating the crystallization process, to pull out the capsule 13 from the furnace 2 and bring it back to the magazine 9.

The feeding unit 32 consists of five main parts shown in FIG. 1a, namely the cooled flange 1, the magazine of capsules 9, the revolving manipulating means, the covering lid and the capsule holder 12.

The cooled flange can be mounted with screws 121 on the surface of a space object (space vehicle), whereon a rim 120 is prepared for this aim. Of course the cooled flange 1 can be mounted also on a vacuum arrangement during testing in the laboratory on the earth. The cooled flange 1 bears the magazine of capsules 9 and the furnace 2. The furnace 2 can be mounted in different ways. A first preferred embodiment is when the furnace is mounted directly by screws and distance members mounting struts 125 on the mounted flange 1, as shown in FIG. 4. Another preferred possibility is to mount the furnace 2 by fitting flange 122 and orientating flange 123; made of steel on the surface of a rim 120 of the space object (FIGS. 1a and 1b) wherein the fixation is done by a fitting flange 122 having an inner cone and an orientating flange 123 equipped with an outer cone. In this way the furnace unit 31 can be easily divided from the feeding unit 32 mounted on the rim 120 of the space object. The furnace is fixed by screws 124 to the orientating flange 123 and fitting flange 122 forming a brace can be pulled out. In this way the furnace 2 becomes free.

As mentioned, the cooled flange 1 and the cooled neck part 7 are connected with a cooling system. In the cooled flange I there are cooling recesses 126. In the cooled neck part 7 there are cooling holes 127. The flow path of the cooling liquid is shown in FIG. 3. The flow path begins at an inlet hole 128 prepared at the edge of the cooled flange 1, then a mounted union nut 129. Thereafter the cooling liquid flows over the contacting means 21 of the thermoelement 20, then around the mantle it reaches the cooled neck part 7 and following two circular lines it flows to the cooled flange 1. At the edges of the cooled flange 1 the cooling liquid, heated up by the system, is discharged from the system by the mounted union nut 129 connected with an outlet hole 130 (FIGS. 3, 6a, 9b, 9c, 9e).

Figure 8:
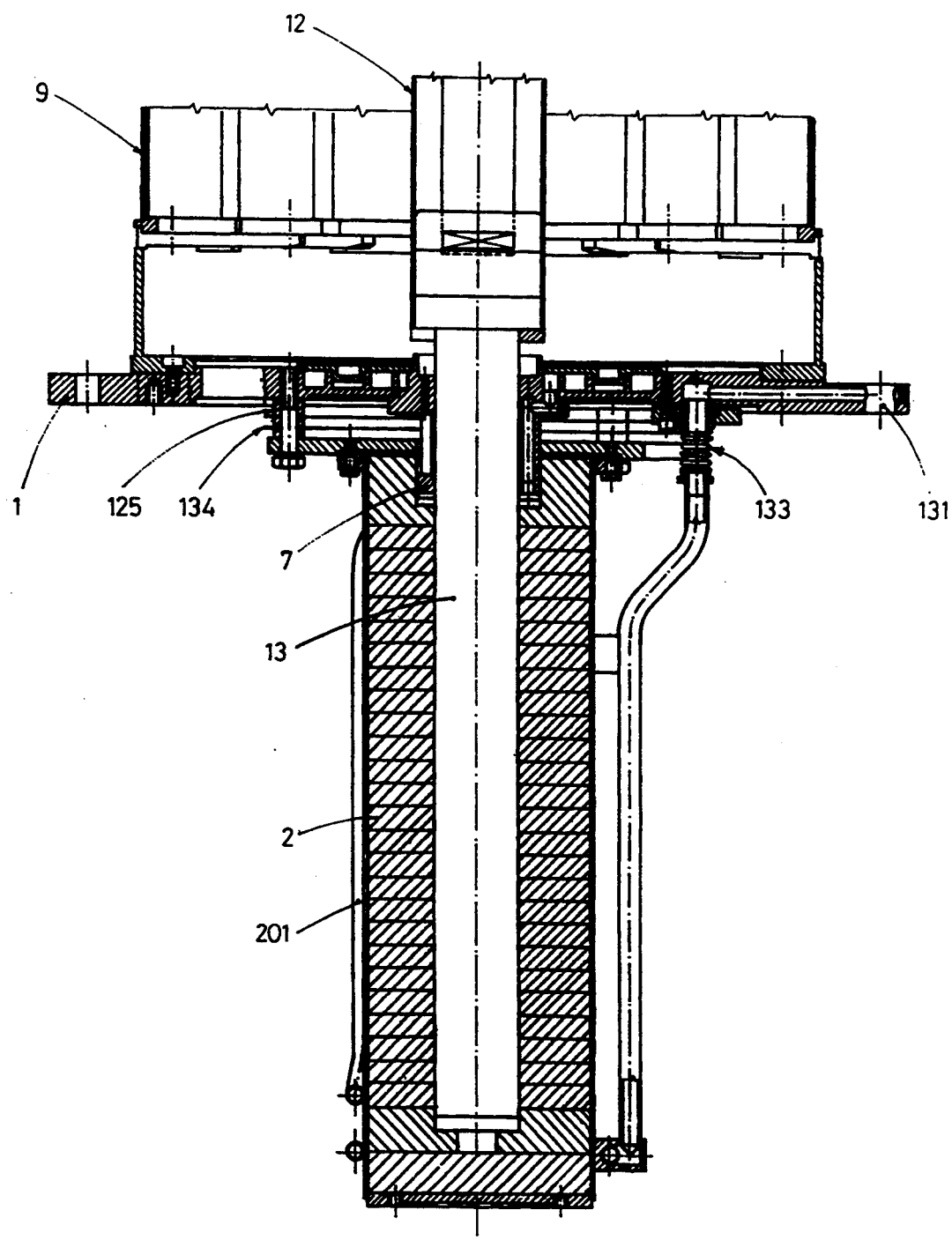

The furnace 2 is equipped with a double cooling system (FIG. 8). The cold cooling liquid enters the system by the mounted union nut 129 arranged in an inlet hole 131 at the edge of the cooled flange 1. It flows in a pipe coil 201 around the inner space of the furnace 2 and is discharged by an outlet hole 132 at the mounted union nut 129 (FIG. 6a). In the pipe coil 201 there is a flexible element 133 inserted. The cooling flange 1 is protected against the heat radiation by thermal screening sheets 134 (FIG. 4). The pipe coil 201 is connected in parallel with the cooling system of the cooled flange 1. The common pipes of the cooling systems are connected with the outlet of the cooling system of the space vehicle.

The capsule holder 9 is a member made of an aluminium alloy. It is a finned cylinder having ribs on its inner surface. The mantle of the cylinder is prepared with openings. The inner surface of the tinned cylinder 135 is equipped with upper and lower flanges 136 and 137. On the upper and lower flanges there are cutouts 139 (FIGS. 5a, 6a) determined by an arched segment 138 and parallel lines. The opening of the cutouts is a circle segment with central angle of 36°. The axial movement and fixation of the capsule holder 12 is ensured by upper and lower working racks 141, 142 oblong the parallel sides. Between the upper and lower working racks 141 and 142 is a distance 143 being the same as the length 144 of the cutout on the mantle of the capsule holder 12 (FIG. 1a). In the upper and lower flanges 135 and 136 there are cutouts 140 having parallel surfaces lying a distance 145 from one another and the distance 145 is the same as length of a chord 146 of the capsule holder 12 or a distance 149 between the flattened part in the head part 18 of the capsule 13. These measures ensure that the capsule holder 12 together with the capsule can be moved without the danger of loosing the capsule 13.

The revolving manipulating means 115 contains a revolving drum 155 made of an aluminium alloy. This drum constitutes a cylindric tube closed by both ends by respective covers. On the mantle of the tube there are lengthy cutouts of width corresponding to the diameter of the capsule holder 12 and cutouts 146, 149 having width identical with measures of the flattened part of the capsule 13. These cutouts allow the capsule holder 12 and capsule 13 to be introduced into the axial line 156 of the revolving manipulating means 15 when they are taken out from the magazine of capsules 9.

The driving mechanism ensures that within the revolving drum 155 in radial, and axial directions 152 and 153 and further along the swing 154 it is possible to move the capsules 13. The driving mechanisms of these movements are based on two motors 157 contacted with a gear reducer 158 of high transmission rate. The double use of motors is necessary because of reliability grounds.

When carrying out the movement in radial direction the motor 157 acts through a gear wheel 159 arranged on the axle of the gear reducer 158 having a high transmission rate (FIGS. 7a and 5b), prestretched springs 160 and 161 surround a further gear wheel 162 engaged with the gear wheel 159. The gear wheel 162 is arranged on a threaded spindle 163 wherein the thread is made with three beginnings and the spindle is supported by bearings on both ends. The end parts of the threaded spindle 163 are connected also with further gear wheels 164 and 165 (FIGS. 5b, 6b), which should cover one another as precisely as possible. The gear wheels 164, 165 are engaged with respective intermediate gear wheels 168, 169 and the last are connected with gear racks for translating retractor plates 166, 167.

The retractor plates 166, 167 are guided in a radial direction on straight conducting means 170, 171 and they can revolve together with the revolving drum 155. On the retractor plates 166, 167 arcuate retracting borders 172, 173, 174, 175 are provided which surround the capsule holder 12. If the retractor plates 166, 167 are in their extreme positions (FIG. 7a and 7b) they can revolve following an arcuate line and the arcuate retracting borders 172, 173, 174, 175 become capable of receiving another capsule holder 12. By the radial movement of the retractor plates 166, 167 the capsule holder 12 and the capsule 13 can be forwarded into the axial line 156. From the retractor plates 166, 167 that signed by 166 is the upper retractor plate and the other is the lower. The revolving movement should be synchronized as precisely as possible. The upper conducting means 170 match into recesses 62 on the head part 18 of the capsule 13, the capsule 13 itself matches between the conducting means 170, 171, the dimensions of the distance 145 and the chored 146 are the same, and in this way the capsule 13 together with the capsule holder 12 can be slid on the conducting means 170. In the middle position the capsule holder 12 is fixed by the rim 110 in an axial direction. In the radial direction a hole 176, prepared on the cover part, serves to orient and the diameter of this hole 176 is equal with the outer diameter of the capsule 13. The capsule is fixed by the actuating fork 177.

There are drives based on motor 157 applied for translation of the retractor plates 166, 167 in radial direction 152. The retractor plates can be fixed in their extreme position by the drives having prestretched springs.

The movement in the axial direction 153 is for transporting the capsule 13 into the furnace 2 and in the reverse direction. The middle position of the capsule 13 is designed for slipping it onto the actuating fork 177. In the actuating fork 177 there is a fork space 178 which is equal in distance with the dimensions of the flattened part of the capsule 13, and the thickness 179 of the actuating fork 177 is equal with the width 150 of the recess of the capsule 13.

The actuating fork 177 is connected with two threaded spindles 180, 181 rotated with the same speed and supported on bearings. The threaded spindles 180, 181 are driven by the electric motor 157 connected with the gear reducer 158 having a high transmission rate. The connection between the threaded spindles 180, 181 and the motor 157 is realized by respective transmissions consisting of gear wheels 182, 183, 184, 185, 186. These connections are shown in FIG. 7e showing a part of FIG. 7a. The drive is prepared in that the direction of rotation of the motor 157 determines the direction of the movement of the capsule 13, i.e. the actuating fork 177 introduces or pulls out the capsule 13 into or from the capsule depending on the direction of rotation of the motor 157.

The actuating fork 177 is guided by the capsule holder 12 fixed in the axial line 156 and this is ensured by the matching dimensions of the capsule holder 12 and the actuating fork 177, because the chord 146 is equal with the fork space 178 and the distance 148 with the measure 187. The capsule 13 is translated into a vertical direction by the capsule holder 12. The rotation is stopped always by the actuating fork 177.

The swing 154 is realized by a gear segment 189 engaged with a gear wheel 188. In this connection also the motor 157 is the drive which rotates a gear wheel 190 through the gear reducer 158 (FIGS. 7c and 7b). The gear wheel 190 is connected with a gear wheel 193 of a loose block wheel 192 supported by bearings on an axle 191. The gear segment 189 rotates together with the last and makes an intermittent movement on the gear wheel 188 having an internal gear.

Because the axle 191 of the gear segment 189 is fixed in the revolving drum 155, namely on an outer line of an upper cover 195 of this revolving drum 155, when the gear segment 189 carries out an entire translation and is engaged with the inner gear of the gear wheel 188, the revolving drum 155 makes a rotation of 36° angle.

Before terminating this intermittent movement a segment 197, which is adjustable and fixable by screws 196 and rotates together with the gear segment 189, partly rotates into an arcuated cutout 194 of a disc 198. When the gear segment 189, is released from the connection the whole segment 197 moves into the arcuated cutout 194 and gives a blockade preventing further rotational movement. The blockade results also in actuating a position sensor which causes the motor 157 to be stopped. If a new intermittent movement is necessary the motor 157 makes the segment 197 and gear segment 189 rotate through the transmission shown above and consisting of the gear wheels 190, 193, axle 191, and loose block wheel 192. If the segment 197 is in engagement with only a part of the arcuated cutout 194, the gear segment 189 is connected with the inner gear of the gear wheel 188 and this is the beginning of a new swing 154. The segment 197 leaves step by step the arcuate cutout 194 Of the disc 198. For precise fixation of the movement there are screws whereby the disc 198 can be fixed in a predetermined position in relation to the gear wheel 188.

The position of the revolving drum 155 in the axial direction can be fixed by the roller pins 14 and sliding rings. The roller pins 14 guide the revolving drum 155 on the inner edge of a closing disc 203. In the radial direction the inner flanges 136 and 137 of the capsule holder 12 and the capsule holders 12 serve for fixation of this position. The end positions of the movements are signalized by two electric sensors, they are doubled for reliability.

The capsules 13 receive the substances to be processed in the apparatus of the invention and serve as a vessel during the transport of these substances before and after processing. The substances can be of solid state and melted in the working space 3 of the furnace 2 or of liquid state.

Thus, the most important feature of the apparatus of the invention is that during the crystallization process both the capsule 13 and the furnace 2 are standing, whereby the contents of the capsule 13 are subjected to vibration and microgravitational effects only before beginning and after terminating the essential steps of the crystallization process, wherein the capsule of the invention creates very favorable conditions for processing.

Some example of materials to be produced or melted in the apparatus of the invention:
—pure metals;
—special alloys;
—semiconducting materials;
—eutectites;
—composite materials; and
—amorphous materials.

The special units of the apparatus and the capsule 13, as proposed by the present invention, ensure over the preferable conditions of storing a liquid or solid material also the possibility of carrying out measurements of the temperature and, if appropriate sensors are available, other parameters of the environment of the crystallization process. The measured data can be registered. With the use of the capsules 13 the process of solidifying can be observed and checked, thus, the apparatus of the invention renders the control, observation and registration possible, and there is no need for complicated simulation which has been in practice in the laboratories situated on the ground for preparing the investigations and which has been always disturbed by the convective flows not present in the cosmic space conditions. The thermal "history" of the pieces of substances processed in this way can be registrated without difficulties, and the influence of the temperature conditions on the crystallization process can be identified.

In the apparatus of the invention it is important to carry out the measurements of the temperature.

A. Measurement of low temperatures

If the melting processes are carried out in temperature range below cca. 1300° C., the wall of the crucible 16 of the capsules 13 can be equipped with thermoelements 20 prepared in the form of wires 34 of 1.5 mm diameter made of nickel and chromium nickel (Ni-CrNi, i.e. Kromel-Alumel). At the maximal temperature of the melting process the highest thermovoltage when applying such thermoelements 20 is about 52400 $\mu V$. The cold point of the arrangement is an annular contact, the temperature of which is continuously measured with a separate respective sensing unit. The contacting means are kept at the same fixed temperature because they are cooled by water. The absolute temperature of the warm point can be determined as the sum of the temperature value determined from the thermovoltage and the temperature of the cold point.

B. Measurement of high temperatures

Figure 10A:
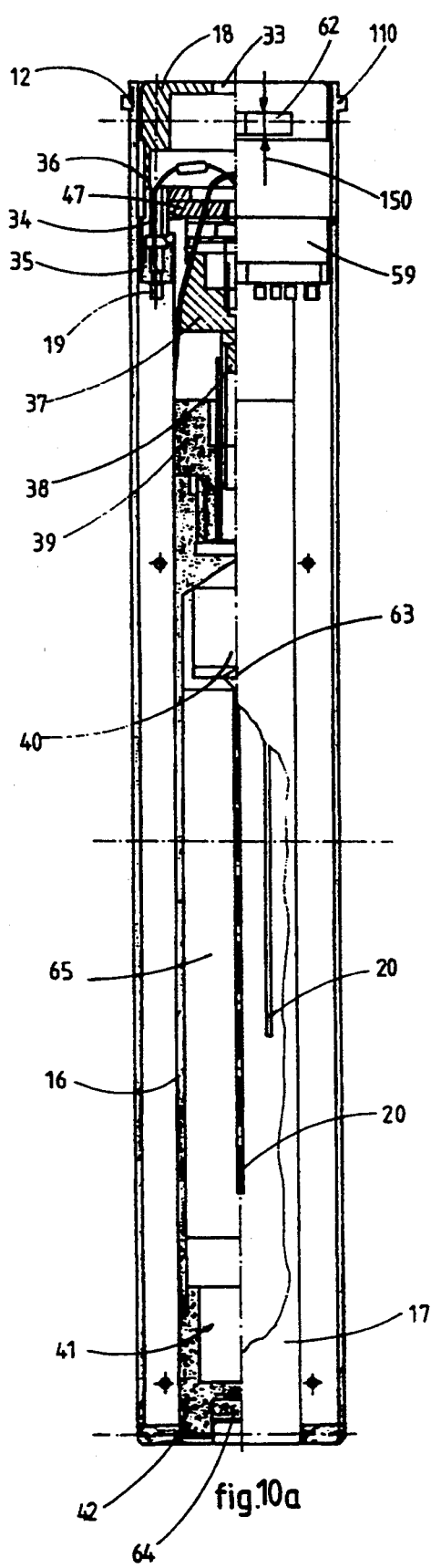
Figure 10B:
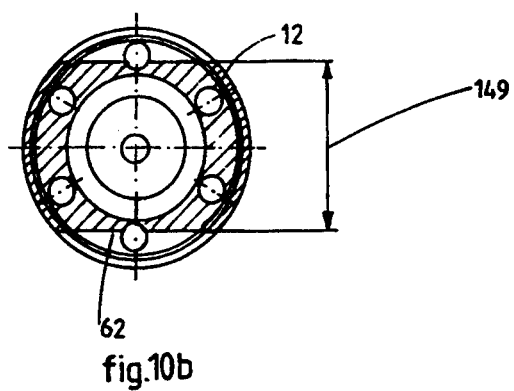
Figure 10C:
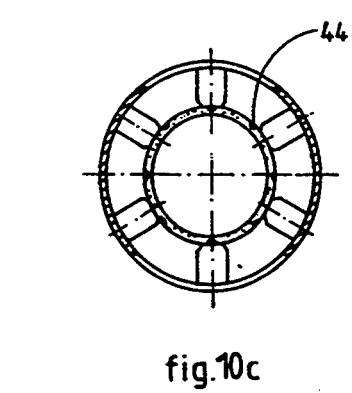
Figure 10D:
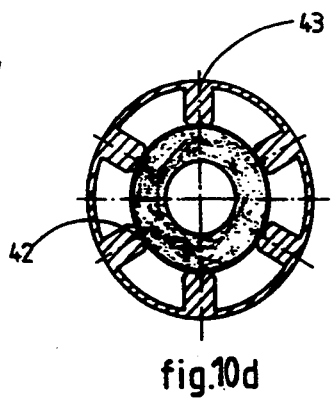

When applying capsules 13 for receiving substances to be processed at temperatures as high as about 1500° C. or higher below the mantle 17 of the capsule 13 the wall of the crucible 16 should be equipped with alloy platinum wires 34 forming the thermoelements 20. These wires 34 are made of rhodium and are about 30 wt % platinum, or of rhodium and about 6 wt % platinum form the thermoelements 20 which are surrounded by a molybdenum cover, wherein the wires 34 are embedded in magnesia powder forming an insulating layer within the ceramic wall of the crucible 16 (FIG. 10a).

The wires 34 of the thermoelements 20 are in any way insulated from the mantle 17, therefore the earth potential of the mantle 17 makes it possible to avoid the disturbing effects of different outer voltages.

Because of the special temperature-voltage characteristics the platinum based thermoelements are characterized with, there is no need for compensation of the cold point. In the temperature range from 0° C. to 100° C., the thermovoltage is very low and this fact results in the lack of real influence on the accuracy of the measurement results.

Figures 11A, 11B:
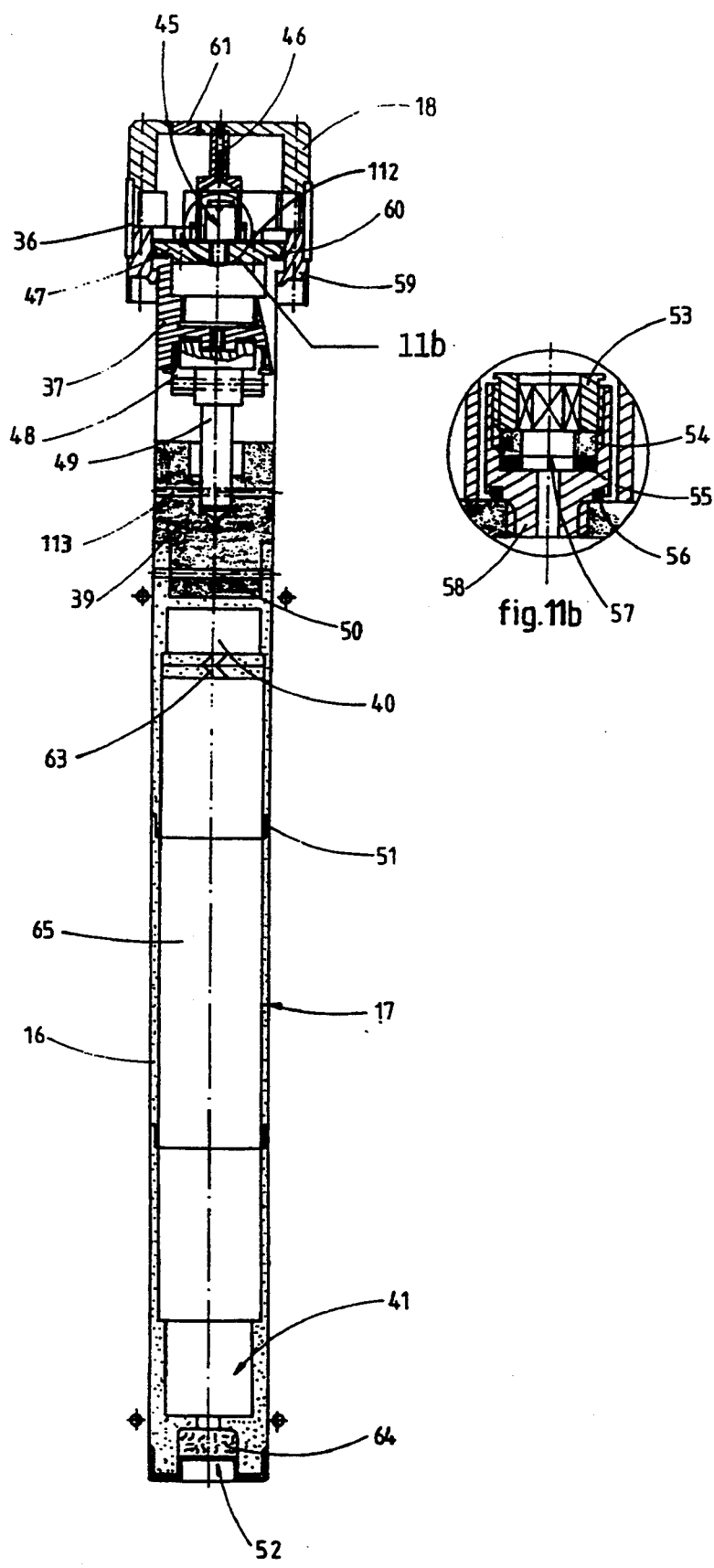

The capsules 13 of the invention, as mentioned, can be made of opened (FIGS. 10a to 10d) and closed designs (FIGS. 11a and 11b).

The capsules 13 of opened design are prepared with an upper opening in the head part 18 whereby their inner space communicates with the heating space of the furnace 2, i.e. the working space 3. This means, the gas filling out the inner space of the furnace 2 can flow in a way including the inner space of the capsule 13. The piece of material to be processed can be arranged in this case in a ceramic tube forming the crucible 16 and made with a flange for supporting in the head part 18. The mantle of this tube is prepared with grooves for receiving the wires 34 of the thermoelements 20. The thermoelements 20 are connected through gold plated contacting means to an outer computer system for data processing. The contacts of the contacting means can form a closed way of electric current only when the capsules 13 are arranged within the furnace 2. Regularly pairs of contacts 18 are prepared, this is sufficient for arranging 8 or 9 thermoelements 20, wherein the higher number is possible to apply when no cold point compensation is necessary. If such kind of compensation is required, one pair of the contacts should be reserved for this purpose. Two kinds of this capsule design can be applied. Both of them can be used in atmospheric pressure conditions and in vacuum: one of them works at lower, the other one at higher temperatures. The head part 18 of the capsule can be made with holes when applying the apparatus in the cosmic space conditions because the high vacuum of the cosmic space can be more effective through these holes for removal of the rest of the gas molecules from the inner space of the furnace 2. Hence, it follows that in the capsules 13 before starting the cosmic vehicle the atmospheric pressure is present and the pressure is stepwise reduced up to the end value being about $10^{-8}$ bar.

The capsules ensure an experimental space region 65 wherein liquid or solid material is arranged in order to introduce it into the inner space of the furnace 2. The contact with the environment is ensured by a window 33 allowing a free way from this environment to the space region 65. This is why the pressure can be stepwise reduced to the end value mentioned above.

In FIGS. 10a to 10d the capsule opened design is shown for production of monocrystalline bars. In the experimental space region 65 pure metal or alloy is arranged which is subjected to zone melting that flows into a container 40 of seed crystals through a seed trap and, after melting the material, a part of the melt is introduced into a further container 41. From the container 40 the seeds are introduced into respective traps wherein only one seed in each can be grown. The history of the experiment can be followed by the information won from the thermoelements 20, which are arranged as mentioned within the recesses 44 prepared in the wall of the crucible 16. The thermoelements can be introduced into the head pads 18 by the action of suspending elements 37 wherein compensation wires 34 conduct the thermovoltage signals to the contacting means 19 arranged within a contact holder 35. The ceramic crucible 16 ensuring the experimental space region 65 is connected with the suspending element 37 by a ceramic threaded spindle 38 through a radial heat transfer element 39. The radial heat transfer element is arranged in the height of the cooled neck part 7 and this arrangement ensures the heat retraction in an axial direction. The shaft of the capsule 13 (FIG. 4) is fixed in the furnace 2 by respective elements supported on ceramic pins 202. The filler composition 64 made of a fibre ceramic is intended to reduce the dangerous vibration before acting on the crucible 16.

The capsules of closed design are advantageous in that the inner space of the proposed capsule 13 can be fully separated from the inner space (working space 3) of the furnace 2. Hence, a special valve system should be applied in the head part 18 for removing gases or for filling out the inner space of the capsule 13 with a gaseous atmosphere of required composition, which means that the atmosphere can be composed of different gases and vapors. The head part 18 should be equipped with special protecting means for avoiding destructive effects of over pressure. The handling of closed capsules 13 requires special laboratoric means while preparing the apparatus of the invention to work. After arranging the capsules 13 in the capsule holders 12 further special handling is not necessary.

The outer shape of the capsule 13 of closed design does not differ from that of an opened design. A valve 45 is applied for closing the inner space 3 of the capsule 13 (FIG. 11b) whereby a vacuum pump or a source of vapor can be connected with the capsule 13. In the closing lid 47 of this capsule the valve 45 is intended to adjust the inner pressure as required. This valve 45 consists of a body 58 arranged by a thread in the cover, an inner ring 55, an outer ring 54, and a disc 57 arranged between the rings 54 and 55. The valve is fixed by a nut 53. The closing lid is sealed by a sealing element 60 and another sealant 56 is applied at the valve 45. If the capsule 13 is under high pressure, from safety reasons the disc 57 is applied which splits and allows valve 45 to form a channel for forwarding the inner pressure into the environment of the capsule 13.

The thermoelements 20 are connected with the contacting means 19 by lead-throughs welded into the covering lid 47. In the head part 18 silicon rubber can be applied for fixation of the wires of the thermoelements. As shown in FIG. 11a the shaft of the capsule 13 can be prepared in a way differing from that shown in FIG. 10a. In the last case the experimental space region 65 is surrounded by the crucible 16 which is contacted by a ceramic adhesive 51 to the capsule 13 and the radial heat transfer element 39 is connected by pin 50 with the crucible 16 and a further pin 113 with a ceramic suspending bar 49 fixed to the suspending element 37 by a nut 48. The capsules of closed design require specific tools and laboratorium for preparing them for the experiments.

In different points of the furnace 2 the temperature is measured and the required temperature value is established by a real time data processing system based on a algorithm following from the thermal model of the apparatus. In this way specific temperature maps can be prepared having a double function: from one side they are helpful in reproduction and understanding of the history of the crystallization process carried out by the apparatus and may be used in an on-line system for temperature control.

The crystallization processes realizable by the apparatus of the invention show basic differences from the known solutions. One of the novel crystallization processes is based on migration of a temperature front in the axial direction beginning from the cooled side of the working pierce. This migration is controlled by specific, especially microprocessor means influencing the work of the heating elements 4 assigned to the heating zones of the furnace 2. This is a multizone crystallization process wherein a low temperature gradient is ensured and the speed of crystallization is also low. In the other crystallization process the temperature field is stable, the capsule is kept in continuous movement and the crystal is growing during this movement. So the temperature gradient can be regulated and thereby the speed of crystallization, too. If required, the two processes mentioned above can be mixed, hence, the multizone migration method is combined with the movement of the capsules.

If the continuous movement should be ensured or the two processes mentioned above should be combined, the contacting means 19 and 21 cannot be stable. Slight contacts should be applied which can replace or complete the pin type contacting means shown in the drawings.

If the apparatus of the invention is arranged in a space laboratory and the launching vehicle has limited capacity, the magazine of capsules should be removable from the apparatus in order to bring it back to the earth.

We claim:

1. An apparatus for carrying out a process of crystallization in cosmic space conditions, comprising:
    a cooling system;
    a control unit;
    a first compartment forming a multizone furnace having an inner surface, said inner surface being divided into plural heating zones for heating up material pieces to be processed by crystallization, said heating zones being connected to said control unit for controlling a heating process in respective heating zones independently of one another;
    capsules for receiving the material pieces;
    capsule holders for holding said capsules;
    a second compartment having two annular rims being separated from each other by a distance, said two annular rims each having cutouts for fixing, orienting and receiving said capsule holders, said capsule holders and said two annular rims forming a magazine of capsules;
    a cooled flange including a cooled neck, said cooled flange connecting said first and second compartments with one another to form a common closed space, said cooled neck being connected to said cooling system; and
    revolving manipulating means for forwarding a selected capsule in said common space from said second compartment through said cooled neck into said first compartment for the crystallization process, and for pulling said selected capsule back from said first compartment after terminating the crystallization process.

2. An apparatus as defined in claim 1, further comprising an orientating flange and a fitting flange; said orientating flange, said fitting flange and said cooling system being connected to said cooled flange.

3. An apparatus as defined in claim 1, further comprising means for guiding and fixing said capsule in said first compartment.

4. An apparatus as defined in claim 1, further comprising roller pins for fixing and orienting said revolving manipulating means when said capsules are forwarded into said first compartment and pulled back therefrom.

5. An apparatus as defined in claim 1, wherein each said capsule comprises a respective thermoelement for generating an electrical signal, and a head portion having a contact connected to the respective thermoelement.

6. The apparatus as defined in claim 5, wherein said cooled flange is annular and has a hollow inner spaced said cooling system being connected to said inner space for receiving a cooling liquid from said cooling system; said cooled flange comprising an additional contact for forwarding the electric signals from said thermoelements.

7. The apparatus as defined in claim 6 wherein said contacts comprise pin contact elements.

8. The apparatus as defined in claim 6, wherein said contacts comprise sliding contact elements being slidable against one another.

9. The apparatus as defined in claim 6, wherein each said capsule comprises a ceramic crucible for receiving the material piece to be processed.

10. The apparatus as defined in claim 1, wherein said cooled neck forms a bearing surface for supporting said first compartment.

11. The apparatus as defined in claim 10, further comprising means for detaching said first compartment from said second compartment.

12. A capsule for crystallization of a material piece in cosmic space conditions, comprising:
a metallic mantle;
a tube-shaped crucible having a ceramic wall and being arranged within said metallic mantle, said metallic mantle and crucible each having a corresponding open end;
at least one thermoelement having a respective wire, said thermoelement being built into said ceramic wall and producing electric signals; and
a head part having outer guiding means for guiding the capsule, said head part including contacting means for forwarding said electric signals via said wire to an outer control unit.

13. The capsule as defined in claim 12, wherein said head part includes a sealing element, a lid and an inlet valve for closing said open end of said crucible.

14. The capsule as defined in claim 13, wherein said lid includes said inlet valve, said inlet valve being controllable.

15. The capsule as defined in claim 12, wherein said wire is surrounded by magnesia powder.

16. The capsule as defined in claim 12, wherein said crucible is surrounded by a filler material comprising ceramic filaments.

* * * * *